United States Patent [19]

Grossa

[11] Patent Number: 4,942,060
[45] Date of Patent: Jul. 17, 1990

[54] SOLID IMAGING METHOD UTILIZING PHOTOHARDENABLE COMPOSITIONS OF SELF LIMITING THICKNESS BY PHASE SEPARATION

[75] Inventor: Mario Grossa, Dreieich, Fed. Rep. of Germany

[73] Assignee: E. I. du Pont de Nemours and Company, Wilmington, Del.

[21] Appl. No.: 341,611

[22] Filed: Apr. 21, 1989

[51] Int. Cl.$^5$ .............................................. B05D 3/06
[52] U.S. Cl. ................................. 427/54.1; 427/407.1; 264/22; 264/25
[58] Field of Search .................... 427/54.1, 53.1, 407.1; 264/22, 25

[56] References Cited

U.S. PATENT DOCUMENTS

| | | | |
|---|---|---|---|
| 3,701,748 | 10/1972 | Kroekel | 427/54.1 |
| 4,005,244 | 1/1977 | Wismer et al. | 428/480 |
| 4,078,229 | 3/1978 | Swainson et al. | 340/173 CM |
| 4,288,861 | 9/1981 | Swainson et al. | 365/127 |
| 4,443,392 | 4/1984 | Beckey et al. | 264/25 |
| 4,446,080 | 5/1984 | Karino et al. | 261/39 D |
| 4,571,316 | 2/1986 | Naruse et al. | 264/22 |
| 4,575,330 | 3/1986 | Hull | 425/174 |
| 4,752,498 | 6/1988 | Fudian | 427/54.1 |
| 4,842,782 | 6/1989 | Pontnez et al. | 264/25 |

FOREIGN PATENT DOCUMENTS 250121 6/1987 European Pat. Off. .
1276198 10/1969 United Kingdom .

OTHER PUBLICATIONS

Kodama, Hideo; Rev. Sci. Instrum. 52(11), 1770–1773, Nov. 1981.

Herbert, Alan J.; Journal of Applied Photographic Engineering, 8(4), 185–188, Aug. 1982.

*Primary Examiner*—Stanley Silverman

[57] ABSTRACT

An integral three-dimensional object is formed from a photohardenable liquid composition containing latent deflecting matter which is soluble in the liquid but separates into a separate phase upon photohardening.

7 Claims, 1 Drawing Sheet

SOLID IMAGING METHOD UTILIZING PHOTOHARDENABLE COMPOSITIONS OF SELF LIMITING THICKNESS BY PHASE SEPARATION

FIELD OF THE INVENTION

This invention relates to production of three-dimensional objects by photohardening, and more particularly to a method utilizing photohardenable materials characterized by self limiting the depth of photohardening during irradiation by using phase separation during photohardening.

BACKGROUND OF THE INVENTION

Many systems for production of three-dimensional modeling by photohardening have been proposed. European Patent Application No. 250,121 filed by Scitex Corp. Ltd. on June 6, 1987, provides a good summary of documents pertinent to this art area, including various approaches attributed to Hull, Kodama, and Herbert. Additional background is described in U.S. Pat. No. 4,752,498 issued to Fudim on June 21, 1988.

These approaches relate to the formation of solid sectors of three-dimensional objects in steps by sequential irradiation of areas or volumes sought to be solidified. Various masking techniques are described as well as the use of direct laser writing, i.e., exposing a photohardenable polymer with a laser beam according to a desired pattern and building a three-dimensional model layer by layer.

However, all these approaches fail to identify practical ways of utilizing the advantages of vector scanning combined with means to maintain constant exposure and attain substantially constant final thickness of all hardened portions on each layer throughout the body of the rigid three dimensional object. Furthermore, they fail to recognize very important interrelations within specific ranges of operation, which govern the process and the apparatus parameters in order to render them practical and useful. Such ranges are those of constant exposure levels dependent on the photohardening material, those of minimum distance traveled by the beam at maximum acceleration dependent on the resolution and depth of photohardening, as well as those of maximum beam intensity depend on the photospeed of the photohardenable composition.

The Scitex patent, for example, suggests the use of photomasks or raster scanning for achieving uniform exposure, but does not suggest a solution for keeping the exposure constant in the case of vector scanning. The use of photomasks renders such techniques excessively time consuming and expensive. Raster scanning is also undesirable compared to vector scanning for a number of reasons, including:
- necessity to scan the whole field even if the object to be produced is only a very small part of the total volume,
- considerably increased amount of data to be stored in most cases,
- overall more difficult manipulation of the stored data, and
- the necessity to convert CAD-based vector data to raster data.

On the other hand, in the case of vector scanning only the areas corresponding to the shape of the rigid object have to be scanned, the amount of data to be stored is smaller the data can be manipulated more easily, and "more than 90% of the CAD based machines generate and utilize vector data" (Lasers & Optronics, January 1989, Vol. 8, No. 1, pg. 56). The main reason why laser vector scanning has not been utilized extensively so far is the fact that, despite its advantages, it introduces problems related to the inertia of the optical members, such as mirrors, of the available deflection systems for the currently most convenient actinic radiation sources, such as lasers. Since these systems are electromechanical in nature, there is a finite acceleration involved in reaching any beam velocity. This unavoidable non-uniformity in velocity results in unacceptable thickness variations. Especially in the case of portions of layers having no immediate previous levels of exposure at the high intensity it becomes necessary to use high beam velocities, and therefore, longer acceleration times, which in turn result in thickness non-uniformity. The use of low intensity lasers does not provide a good solution since it makes production of a solid object excessively time consuming. In addition, the usefulness of vector scanning is further minimized unless at least the aforementioned depth and exposure level relationships are observed as evidenced under the Detailed Description of this invention.

No special attention has been paid so far to the composition itself by related art in the field of solid imaging, except in very general terms.

Thus, the compositions usually employed, present a number of different problems, a major one of which is excessive photohardening depthwise usually accompanied by inadequate photohardening widthwise. This problem becomes especially severe in cantilevered or other areas of the rigid object, which areas are not immediately over a substrate.

Therefore, it is an object of this invention to resolve the problem cited above by utilizing phase separation during photohardening in order to self limit the depth of photohardening.

In other fields of art, phase separation has been observed during curing, but it has not been utilized to self control thickness.

U.S. Pat. No. 3,701,748 (Kroekel) describes a composition curable under heat and pressure for molding, containing a thermoplastic polymer which is soluble in the composition, but yields an optically heterogeneous cured composition.

British Pat. No. 1,276,198 describes similar compositions as U.S. Pat. No. 3,701,748.

U.S. Pat. Nos. 4,078,229, 4,288,861, and 4,446,080 (Swainson et al.) describe holographic techniques utilizing two or more beams for multiple proton absorption for production of physical or refractive index inhomogeneities at the intersection of the beams.

SUMMARY OF THE INVENTION

This invention relates to production of three-dimensional objects by photohardening, and more particularly to a method utilizing photohardenable materials characterized by self limiting the depth of photohardening by using phase separation during photohardening, and it may be summarized as follows:

A method for accurately fabricating an integral three dimensional object from successive layers of a photohardenable liquid composition comprising the steps of:
 (a) forming a layer of a photohardenable liquid;
 (b) photohardening at least a portion of the layer of photohardenable liquid by exposure to actinic radiation;

(c) introducing a new layer of photohardenable liquid onto the layer previously exposed to actinic radiation;

(d) photohardening at least a portion of the new liquid layer by exposure to actinic radiation, with the requirement that the photohardenable composition comprises an ethylenically unsaturated monomer, a photoinitiator, and a latent radiation deflecting matter, the latent radiation deflecting matter being in solution within the composition, and separating into a separate phase upon photohardening the composition by subjecting it to the actinic radiation, the separate phase having a first index of refraction and the rest of the photohardened composition having a second index of refraction, and wherein the absolute value of the difference between the first index of refraction and the second index of refraction is greater than 0.01.

BRIEF DESCRIPTION OF THE DRAWING

The reader's understanding of practical implementation of preferred embodiments of the invention will be enhanced by reference to the following detailed description taken in conjunction with perusal of the drawing figure, wherein.

DETAILED DESCRIPTION OF THE INVENTION

Figure 1:
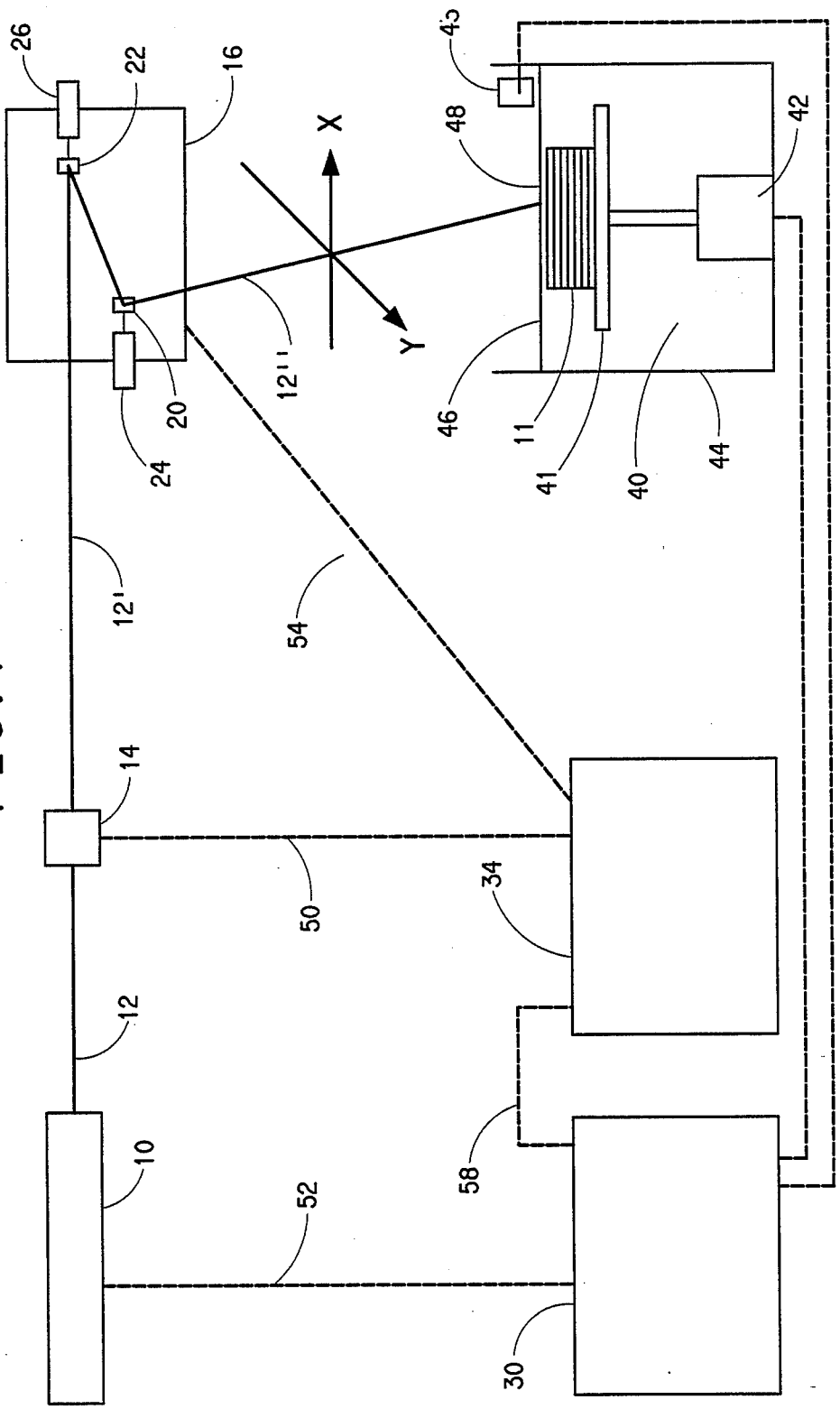
FIG. 1 is a block diagram of an apparatus used to perform the preferred embodiment of the process of the instant invention.

The instant invention is directed to compositions and methods for direct production of three-dimensional photohardened solid objects, layer by layer using actinic radiation, preferably in a beam form such as provided by lasers for direct writing. The compositions utilized in this invention provide self limiting characteristics regarding the depth of photohardening by phase separation, as discussed in detail below.

As aforementioned, many systems for production of three-dimensional modeling by photohardening have been proposed. European Patent Application No. 250,121 filed by Scitex Corp. Ltd. on June 6, 1987, provides a good summary of documents pertinent to this art area, including various approaches attributed to Hull, Kodama, and Herbert. Additional background is described in U.S. Pat. No. 4,752,498 issued to Fudim on June 21, 1988.

In a preferred embodiment, an apparatus for practicing the present invention is depicted in FIG. 1, in the form of a block diagram. The apparatus and its operation are described below.

Actinic radiation means 10 shown in FIG. 1, which is preferably a high power laser, is used to provide an actinic radiation beam 12 having a certain intensity. The radiation beam 12 is passed through a modulator 14, where its intensity may be modulated. The modulated beam 12' is passed in turn through deflection means 16 such as a vector scanner in the form of a two-mirror 20 and 22 assembly, each mirror separately driven by a different motor 24 and 26 respectively. By causing mirror 20 driven by motor 24 to turn, the beam is deflected in an X direction, while by causing mirror 22 to turn, the beam is deflected in a Y direction, X direction being perpendicular to the Y direction. The actinic radiation beam 12" is thus controllably deflected towards preselected portions of the photohardenable composition which is contained in vessel 44 and presents a surface 46. It photohardens a thin layer 48 closest to the surface 46 of a photohardenable composition 40, to a depth of photohardening which equals the maximum thickness of the layer 48. The composite movement of the beam is preferably a vector type movement, and the beam is said to move or be scanned in a vector mode. Due to the inertia of the electromechanical deflection means 16, the velocity of the beam 12" on the thin layer 48 is also limited by the inertia and the electromechanical nature of the deflection means 16.

The deflection of the two mirrors 20 and 22 through motors 24 and 26 respectively is controlled by the second computer control means 34, while the graphic data corresponding to the shape of the solid object under production are stored in the first computer control means 30.

The second computer- control means 34 is coupled with the modulation means 14, the deflection means 16 and the first computer control means 30, through control/feedback lines 50, 54, and 58, respectively. The graphic data stored in computer control means 30 are fed to computer control means 34, and after being processed cause motors 24 and 26 to turn and move mirrors 20 and 22 accordingly in order to deflect the beam towards predetermined positions on the thin layer 48. Electrical feedback regarding the relative movements of the mirrors 20 and 22 is provided by the deflection means to the second computer control means 34 through line 54.

The manner of introducing successive layers of photohardenable liquid and exposing to actinic radiation such as a laser will generally be by two methods. In a first method a pool of liquid is present in a vessel and it is not necessary to introduce additional photohardenable liquid. In such case a movable table or floor supports the liquid. Initially the table or floor is elevated with a portion of the photohardenable liquid present above the table or floor and a portion of the liquid present in the vessel around the edge of the table or floor and/or underneath it. (Illustratively a table is present which allows liquid to flow underneath the table as it is used.) After exposure and photohardening of a portion of the liquid layer above the table, the table is lowered to allow another layer of photohardenable liquid to flow on top of the previous layer followed by exposure of predetermined area on the newly applied liquid layer. If necessary due to the shape of the final three dimensional article the thickness of more than one liquid layer can be photohardened. This procedure of table or floor lowering and exposure continues until formation of the desired three dimensional article occurs.

In a second method a movable table or floor need not be employed but rather a new quantity of photohardenable liquid is introduced into a vessel after an exposure step in formation of a new liquid layer on a previously exposed layer containing both photohardened material and photohardenable liquid. Criticality is not present in the manner of liquid introduction but rather in an ability to photoharden successive liquid layers.

In FIG. 1, a movable table 41 is initially positioned within the photohardenable composition 40, a short predetermined distance from the surface 46, providing a thin layer 48 between the surface 46 and the table 41. The positioning of the table is provided by the placement means 42, which in turn is controlled by the first computer control means 30 according to the data stored therein. The graphic data corresponding to the first layer of the shape of the rigid object are fed from computer control means 30 to computer control means 34, where they are processed along with feedback data obtained from deflecting means 16, and are fed to modulator 14 for controlling the same, so that when the beam travels in a vector mode on predetermined portions of the thin layer 48, the exposure remains constant.

When the first layer of the rigid object is complete, the movable table 41 is lowered by a small predetermined distance by the placement means 42 through a command from first computer control means 30 Following a similar command from computer means 30, layer forming means, such as doctor knife 43 sweeps the surface 46 for leveling purposes. The same procedure is then followed for producing the second, third, and the following layers until the rigid object is completed.

In the discussions above and below, the actinic radiation, preferably in the form of a beam, is many times referred to as light, or it is given other connotations. This is done to make the discussion clearer in view of the particular example being described. Thus, it should not be taken as restricting the scope and limits of this invention. Nevertheless, the preferred actinic radiation is light, including ultraviolet (UV), visible, and infrared (IR) light. From these three wavelength regions of light, ultraviolet is even more preferred.

The formulation of the photohardenable compositions for solid imaging purposes is very important in order to receive the desirable effects and characteristics, regardless of whether the scanning is of the vector type, raster type, or any other type, and the discussion hereinafter is referred to in any type of scanning, unless otherwise stated. However, from the different types of scanning, the vector type is the preferred type of scanning.

A photohardenable composition for solid imaging should contain at least one photohardenable monomer or oligomer and at least one photoinitiator. For the purposes of this invention, the words monomer and oligomer have substantially the same meaning and they may be used interchangeably.

Examples of suitable monomers which can be used alone or in combination with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-radiation, hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di(p-hydroxyphenyl)propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Particularly preferred monomers are ethoxylated trimethylolpropane triacrylate, ethylated pentaerythritol triacrylate, dipentaerythritol monohydroxypentaacrylate 1,10-decanediol dimethylacrylate, di-(3-acryloxy-2-hydroxylpropyl)ether of bisphenol A oligomers, di-(3-methacryloxy-2-hydroxyl alkyl)ether of bisphenol A oligomers, urethane diacrylates and methacrylates and oligomers thereof, coprolactone acrylates and methacrylates, propoxylated neopentyl glycol diacrylate and methacrylate, and mixtures thereof.

Examples of photoinitiators which are useful in the present invention alone or in combination are described in U.S. Pat. No. 2,760,863 and include vicinal ketaldonyl alcohols such as benzoin, pivaloin, acyloin ethers, e.g., benzoin methyl and ethyl ethers, benzil dimethyl ketal; α-hydrocarbon-substituted aromatic acyloins, including α-methylbenzoin α-allylbenzoin, α-phenylbenzoin, 1-hydroxylcyclohexyl phenol ketone, diethoxyphenol acetophenone, 2-methyl-1-[4-(methylthio)-phenyl]-2-morpholino-propanone-1. Photoreducible dyes and reducing agents disclosed in U.S. Pat. Nos. 2,850,445, 2,875,047, 3,097,096, 3,074,974, 3,097,097 and 3,145,104, as well as dyes of the phenazine, oxazine, and quinone classes, Michler's ketone, benzophenone, acryloxy benzophenone, 2,4,5-triphenylimidazolyl dimers with hydrogen donors including leuco dyes and mixtures thereof as described in U.S. Pat. Nos. 3,427,161, 3,479,185 and 3,549,367 can be used as initiators. Also useful with photoinitiators are sensitizers disclosed in U.S. Pat. No. 4,162,162. The photoinitiator or photoinitiator system is present in 0.05 to 10% by weight based on the total weight of the photohardenable composition. Other suitable photoinitiation systems which are thermally inactive but which generate free radicals upon exposure to actinic light at or below 185° C. include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthraquinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene-7,12-dione. Also, alpha amino aromatic ketones, halogenated compounds like Trichloromethyl substituted cyclohexadienones and triazines or chlorinated acetophenone derivatives, thioxanthones in presences or tertiary amines, and titanocenes.

Although the preferred mechanism of photohardening is free radical polymerization, other mechanisms of photohardening apply also within the realm of this invention. Such other mechanisms include but are not limited to cationic polymerization, anionic polymerization, condensation polymerization, addition polymerization, and the like.

Other components may also be present in the photohardenable compositions, e.g., pigments, dyes, extenders, thermal inhibitors, interlayer and generally interfacial adhesion promoters, such as organosilane coupling agents, dispersants, surfactants, plasticizers, coating aids such as polyethylene oxides, etc. so long as the photohardenable compositions retain their essential properties.

In this discussion a clear distinction should be made between a photohardenable and a photohardened composition. The former refers to one which has not yet been subjected to irradiation, while the latter refers to one which has been photohardened by irradiation.

When the composition is clear to the radiation beam, the depth of photohardening is considerably larger than the photohardening width, mainly because the beams utilized, such as laser beams, and the like, are well collimated and focused. Addition of inert particulate matter, which is transparent to the radiation in the environment of the composition, has certain well recognized advantages, such as reduction of shrinkage upon polymerization or photohardening in general, and often increase in photospeed due to the reduction of the amount of active composition, which is subject to shrinkage, per unit of volume.

The large depth of photohardening is not a very big problem in areas supported by a substrate, since the depth is determined primarily by the thickness of the liquid layer on top of the substrate. However, in cantilevered unsupported areas, where the thickness of the liquid is very large, it becomes a serious disadvantage, as the depth of photohardening is not controlled or limited any more by the substrate. This is actually the area where the differences between conventional two dimensional imaging and solid or three dimensional imaging manifest themselves as being most profound. Thus, even after the formation of a first layer on the surface of an unsupported area the problem still exists, since the photohardened layer is still at least translucent to the radiation beam in most cases, and further hardening under the first layer may continue to take place. This is believed to occur because portions adjacent to and under the first unsupported photohardened layer, which portions are usually still within the induction region of exposure, need a very small amount of energy to start photohardening. This energy is provided by the successive scannings of the radiation beam through a number of hardened but still at least translucent layers in most cases. This is particularly important when there are uncontrollable exposure variations, which may result in thickness variations, and poor resolution. Thus a way to control the thickness is needed.

In addition to the lack of control of the polymerization depth, there is one more problem having to do with resolution considerations. Except in very limited occasions, it is highly desirable for the resolution or tolerances of a part to be comparable in all dimensions. It does not make much sense to have high resolution in one dimension and very poor resolution in another dimension since the final resolution is going to be necessarily considered as poor, except in rare occasions as mentioned above. In clear compositions, the depth to width ratio is high, and thus the resolution widthwise is accordingly higher than the resolution depthwise. As a matter of fact, the resolution is inversely proportional to the dimensional units, and therefore, if the depth to width ratio is for example 5, the width resolution will be five times better than the depth resolution, when other factors do not play an active role. Thus, high transparency of the composition becomes in general undesirable. Preferable regions of depth to width ratios are 7:1 to 1:1 and more preferable 3:1 to 1:1.

The task of reducing the transparency or in other words increasing the optical density of the photohardenable composition sounds as a rather straightforward one, and it is, if photospeed and other important parameters are not taken into account. For example, addition of a radiation absorbent in the composition will decrease the depth of photohardening without affecting considerably the width. Typical absorbents are dyes, or the photoinitiator itself. The monomers or oligomers of the composition may also act as absorbants to different degrees. However, if a dye, or other absorbent is used, the part of the radiation which is absorbed by it will not be available to directly promote photohardening. It will mostly become heat, which indirectly may also promote the kinetics of photohardening, but its effect will be less noticeable. Thus, loss of photospeed will occur necessarily, unless under limited circumstances when for example the beam itself is a thermal beam, and the mechanism of photohardening is also thermal in nature.

A separate phase of dispersed particulate solid matter, emulsified liquid matter, or even matter in the form of gas may be utilized to control the depth/width relation, under conditions, which involve refraction or reflection or scattering of light or any combination thereof, labelled as radiation deflection for the purposes of this discussion. Suitable conditions constitute for example a substantial difference between the refraction index of the radiation deflection matter and the rest of the photohardenable composition. If everything else is kept constant, as the content in separate phase of radiation deflecting matter is increased, so does the width in expense of the depth. Since the radiation is not absorbed by the deflection matter but just deflected, no considerable loss of radiation occurs, and therefore, there is no substantial loss of photospeed.

The instant invention utilizes compositions which contain a latent radiation deflecting matter. The latent deflecting matter is a material, which is soluble in the photohardenable composition, but it separates upon photohardening to a separate phase by incompatibility, or it produces otherwise a separate phase, the separate phase being in the form of individual domains. The majority of these domains should be smaller than the depth of photohardening and larger than one half the wavelength of the radiation utilized during photohardening. It is preferable that at least 90% of the domains have a diameter smaller than one-half the depth of photohardening, and even more preferable that at least 90% of the domains have a diameter smaller than one-tenth the depth of photohardening. In addition, the separate phase must have a first refraction index, and the photohardened composition must have a second refraction index such that the absolute value of the difference between the first and the second refractive index is larger than 0.01. It is preferable that this difference is larger than 0.02, and even more preferable larger than 0.04.

As the photohardening step is taking place, more and more separate phase is formed resulting in higher and higher opacity, hindering increasingly the penetration of the actinic radiation, and in turn self limiting the depth of photohardening. This method is preferable to the one using suitable dispersed particles in the composition, since it provides the radiation deflection matter in situ, at the areas where it is needed.

The separate phase may be a gas, a liquid, a solid, and mixtures thereof.

Diazides, such as 3,5-Bis-(naphthoquinone diazidesulfonyl) benzoic acid supplied by ROHNER AG Switzerland, for example, may be used as the latent radiation deflecting matter to produce a separate phase in the form of individual domains of nitrogen bubbles, resulting in high opacity and self limiting the depth of photohardening, as better shown in Example 1.

Liquid latent deflecting matter, such as HYCAR 1312X5 from Goodrich (Butadiene/Acrylonitrile, 33% copolymer, viscosity 10000 cP at 50° C.), for example, may also be used, as initially being soluble in the photohardenable composition, and then becoming insoluble or incompatible in the photohardened composition to result in opacity and self limiting of the depth of photohardening as illustrated in Example 3.

Solid latent deflecting matter, such as polystyrene, for example, may also be used as shown in detail in Examples 5, 7, and 8.

In contrast, the same compositions containing no latent radiation deflecting matter possess no self limiting characteristics regarding depth of photohardening, as illustrated by Examples 2, 4, 6, and 9.

The examples of photohardenable compositions given below are for illustration purposes only, and should not be construed as restricting the scope or limits of this invention.

EXAMPLE 1

The following ingredients were mixed:

| Plex 6696 | 98.5 g |
| Benzildimethylketal | 0.5 |
| Diazide | 1 |

Plex 6696 is an oligomer sold by Roehm GmbH., Darmstadt, West Germany. It is represented by the formula TMPTA [S-TMPTA]$_x$-S-TMPTA where TMPTA stands for trimethylol propane triacrylate, and S for sulfur. The refractive index of the oligomer is n = 1.489.

The diazide was 3,5-Bis-(naphthoquinone diazidesulfonyl) benzoic acid supplied by ROHNER AG Switzerland.

This solution contained some undissolved material (part of the diazide), but in general it was clear.

Exposure with fluorescent lamp (UV 360 nm, 300 mJ/cm$^2$) resulted in a solid part which was strongly light scattering and light deflecting in general, due to many bubbles of nitrogen. This translates to good limiting character regarding the depth of photohardening.

The newly formed phase in this case was a gas (nitrogen).

EXAMPLE 2

The following ingredients were mixed:

| Plex 6696 | 9.5 grams |
| Benzildimethylketal | 0.5 |

The photohardenable composition thus made was clear.

Exposure with fluorescent lamp (UV 360 nm, 300 mJ/cm$^2$) resulted in a solid part which was also clear. This translates to poor limiting character regarding the depth of photohardening.

EXAMPLE 3

The following ingredients were mixed:

| Celrad 3700 (bisphenol-A-glycidylether diacrylate) | 50 grams |
| Ethoxylated TMPTA<br>$CH_3CH_2-C(\dot{C}H_2-O-CH_2CH_2-O-COCH=CH_2)_3$ | 20 |
| Plasticizer SC (Mixt. of esters)* | 30 |
| Triton X 100<br>(Octyl phenol poly ether alcohol) | 0.4 |
| Benzildimethylketal | 1.6 |
| HYCAR 1312X5 Goodrich<br>(Butadiene/AN (33%) copolymer viscosity 10000 cP 50° C.) | 30 |

*Plasticizer SC is a mixture of Triethyleneglycol-di-caprate (C6) and di-caprylate (C8).

The photohardenable composition, thus made was clear. Upon exposure as described in Example 1 the liquid solidified to a mass which was opaque. This translates to good self limiting character regarding depth of photohardening.

EXAMPLE 4

The following ingredients were mixed:

| Celrad 3700 (Bisphenol A derived diacrylate) | 50 g |
| Ethoxylated TMPTA | 20 |
| Plasticizer SC (Mixt. of esters) | 30 |
| Triton X 100 | 0.4 |
| Benzildimethylketal | 1.6 |

The photohardenable composition, thus made, was clear. Upon exposure as described in Example 1 the liquid solidified to a mass which was only slightly opaque. This translates to lower limiting character regarding depth of photohardening when compared to the sample of Example 3.

EXAMPLE 5

The following ingredients were mixed:

| Isodecylacrylate<br>$CH_3(CH_3)CH[CH_2]_7OCOCH=CH_2$ | 80 grams |
| Benzildimethylketal | 1 |
| Polystyrene (molecular Weight 250,000) | 20 |

The photohardenable composition, thus made was clear. Upon exposure as described in Example 1 the liquid solidified to a mass which was opaque. This translates to good self limiting character regarding depth of photohardening.

EXAMPLE 6

The following ingredients were mixed:

| Isodecylacrylate<br>$CH_3(CH_3)CH[CH_2]_7OCOCH=CH_2$ | 99 g |
|---|---|
| Benzildimethylketal | 1 |

The photohardenable composition, thus made, was clear. Upon exposure as described in Example 1 the liquid solidified to a mass which was also clear. This translates to poor self limiting character regarding depth of photohardening.

EXAMPLE 7

The following ingredients were mixed:

| Methylmethacrylate | 70 grams |
|---|---|
| CIBA GEIGY CG 250369 | 4.17 |
| Polystyrene (Molecular Weight 250000) | 30 |

CIBA GEIGY 250369 is an acetophenone derivative with a morpholino substituent.

The photohardenable composition, thus made was clear. Upon exposure as described in Example 1 the liquid solidified to a mass which was opaque. This translates to good self limiting character regarding depth of photohardening.

EXAMPLE 8

The following ingredients were mixed:

| Methylmethacrylate | 80 grams |
|---|---|
| CIBA GEIGY CG 250369 | 4.17 |
| Polystyrene (Molecular Weight 250,000) | 20 |

The photohardenable composition, thus made was clear. Upon exposure as described in Example 1 the liquid solidified to a mass which was opaque. This translates to good self limiting character regarding depth of photohardening.

EXAMPLE 9

The following ingredients were mixed:

| Methylmethacrylate | 96 |
|---|---|
| CIBA GEIGY CG 250369 | 4.17 |

The photohardenable composition, thus made, was clear. Upon exposure as described in Example 1 the liquid solidified to a mass which was also clear. This translates to poor self limiting character regarding depth of photohardening.

What is claimed is:

1. A method for accurately fabricating an integral three dimensional object from successive layers of a photohardenable liquid composition comprising the steps of:
    (a) forming a layer of a photohardenable liquid;
    (b) photohardening at least a portion of the layer of photohardenable liquid by exposure to actinic radiation;
    (c) introducing a new layer of photohardenable liquid onto the layer previously exposed to actinic radiation; and
    (d) photohardening at least a portion of the new liquid layer be exposure to actinic radiation, with the requirement that the photohardenable composition comprises an ethylenically unsaturated monomer, a photoinitiator, and a latent radiation deflecting matter, the latent radiation deflecting matter being in solution within the composition, and separating into separate domains upon photohardening the composition by subjecting it to the actinic radiation, the separate domains comprising a gas,, liquid, solid or mixtures thereof wherein at least a majority of the domains are smaller than the depth of photohardening and larger than one-half of the wavelength of the actinic radiation, the separate domains having a first index of refraction and the rest of the photohardened composition having a second index of refraction, and wherein the absolute value of the difference between the first index of refraction and the second index of refraction is greater than 0.01.

2. The method of claim 1, wherein steps (c) and (d) are successively repeated.

3. The method of claim 2, wherein the actinic radiation is in the form of a beam.

4. The method of claim 2, wherein the separate phase is a gas.

5. The method of claim 2, wherein the separate phase is a liquid.

6. The method of claim 2, wherein the separate phase is a solid.

7. The method of claim 3, wherein the beam is a light beam.

* * * * *